United States Patent
Wu et al.

(10) Patent No.: US 10,800,657 B2
(45) Date of Patent: Oct. 13, 2020

(54) SUBSTRATE-FREE 2D TELLURENE

(71) Applicant: Purdue Research Foundation, West Lafayette, IN (US)

(72) Inventors: Wenzhuo Wu, West Lafayette, IN (US); Yixiu Wang, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 8 days.

(21) Appl. No.: 15/995,576

(22) Filed: Jun. 1, 2018

(65) Prior Publication Data

US 2018/0362342 A1    Dec. 20, 2018

Related U.S. Application Data

(60) Provisional application No. 62/521,695, filed on Jun. 19, 2017.

(51) Int. Cl.
| | |
|---|---|
| *C01B 19/02* | (2006.01) |
| *C30B 7/10* | (2006.01) |
| *C30B 29/02* | (2006.01) |
| *C30B 30/00* | (2006.01) |
| *C30B 29/60* | (2006.01) |

(52) U.S. Cl.
CPC ................. *C01B 19/02* (2013.01); *C30B 7/10* (2013.01); *C30B 7/105* (2013.01); *C30B 29/02* (2013.01); *C30B 29/60* (2013.01); *C30B 30/00* (2013.01); *C01P 2002/60* (2013.01); *C01P 2002/74* (2013.01); *C01P 2004/20* (2013.01)

(58) Field of Classification Search
CPC .......... C01B 19/02; C01B 7/105; C01B 30/00
See application file for complete search history.

(56) References Cited

U.S. PATENT DOCUMENTS

| | | | |
|---|---|---|---|
| 2014/0261609 A1* | 9/2014 | Wu | .................. H01L 35/16 136/238 |
| 2016/0370541 A1* | 12/2016 | Ouyang | .................. G02B 6/125 |

OTHER PUBLICATIONS

Xian, Lede "Square Selenene and Tellurene. . ". Universidad Del Pais Vasco, Rice University and Max Planck Institute. Aug. 2016 (Year: 2016).*
Qian, Hai-Sheng et al. "High-Quality Luminescent Tellurium Nanowires.. ." Langmuir, 22, 3830-3835 (2006). (Year: 2006).*
Wang, Y. et al., Large-area solution-grown 2D tellurene for air-stable, high-performance field-effect transistors. Apr. 20, 2017. https://arxiv.org/abs/1704.06202v1.
Zhang G., et al., Design Principle of Telluride-Based Nanowire Heterostructures for Potential Thermoelectric Applications. Nano Lett. 2012, 12, 3627-3633.

* cited by examiner

*Primary Examiner* — Sheng H Davis
(74) *Attorney, Agent, or Firm* — Purdue Research Foundation; Zhigang Rao

(57) ABSTRACT

The present disclosure generally relates to compositions comprising substrate-free 2D tellurene crystals, and the method of making and using the substrate-free 2D tellurene crystals. The 2D tellurene crystals of the present disclosure are characterized by an X-ray diffraction pattern (CuKα radiation, λ=1.54056 A) comprising a peak at 23.79 (2θ±0.1°) and optionally one or more peaks selected from the group consisting of 41.26, 47.79, 50.41, and 64.43 (2θ±0.1°).

8 Claims, No Drawings

SUBSTRATE-FREE 2D TELLURENE

CROSS-REFERENCE TO RELATED APPLICATION

This application claims the benefits of U.S. Provisional Application Ser. No. 62/521,695, filed Jun. 19, 2017. The contents of which are incorporated herein entirely

STATEMENT REGARDING PRIOR DISCLOSURES BY THE INVENTORS OR JOINT INVENTORS UNDER 37 C.F.R. 1.77(b)(6)

Wenzhuo Wu and Yixiu Wang, the inventors or joint inventors of the present disclosure, publicly disclosed information related to the present disclosure in article Wang, Yixiu, et al., Large-area solution-grown 2D tellurene for air-stable, high-performance field-effect transistors, arXiv: 1704.06202, Apr. 20, 2017. The article was first published online on Apr. 20, 2017, which is less than one year from the filing date of the U.S. Provisional Application Ser. No. 521,695, filed Jun. 19, 2017. The other eight listed co-authors Gang Qiu, Qingxiao Wang, Yuanyue Liu, Yuchen Du, Ruoxing Wang, William A. Goddard III, Moon J. Kim, and Peide D. Ye of the article are not inventors for the present disclosure because the eight listed co-authors only provided supervised contributions instead of providing inventive contribution. A copy of a print out of the article is provided on a concurrently filed Information Disclosure Statement (IDS).

TECHNICAL FIELD

The present disclosure generally relates to compositions comprising substrate-free 2D tellurene crystals, and the method of making and using the substrate-free 2D tellurene crystals.

BACKGROUND

This section introduces aspects that may help facilitate a better understanding of the disclosure. Accordingly, these statements are to be read in this light and are not to be understood as admissions about what is or is not prior art.

Research in 2D materials, as inspired by the development of graphene, has experienced an explosive increase in recent years, due to their unique and exceptional properties with promising applications in electronic, photonic, energy and environmental devices. The 2D group-IV materials including silicene, germanene and stanene have been realized experimentally after graphene. For group-V elements, few-layer black phosphorus, named phosphorene, has also been successfully fabricated by exfoliation, which exhibits prominent properties such as high carrier mobility and high on/off ratio. Very recently, the novel 2D group-III material of borophene has been fabricated successfully. Beside the allotropes of single element in 2D family, the 2D transition metal dichalcogenides, such as $MoS_2$, $MoSe_2$, $WS_2$, and $WSe_2$, have been synthesized and attracted both experimental and theoretical interests because of their relatively large and direct band gap as well as good carrier mobilities.

The 2D structures of simple group VI elements has only recently been predicted to be possible. See Zhu et al., Tellurene-a monolayer of tellurium from first-principles prediction, doi:arXiv:1605.03253 (2016). In addition, Chen et al. reported 2D tellurene grown on highly oriented pyrolytic graphite (HOPG) substrate by molecular-beam epitaxy (MBE). See Chen et al., Ultrathin layers of beta-tellurene grown on highly oriented pyrolytic graphite by molecular-beam epitaxy, arXiv:1704.07529 (2017).

There remains a need to develop a method to make substrate-free 2D tellurene due to its potential applications in electronics, optoelectronics, energy conversion and energy storage.

SUMMARY

The present disclosure provides substrate-free 2D tellurene crystals that can be reliably prepared through a substrate-free solution-grown method.

The crystals exhibit process-tunable thicknesses from a few to tens of nanometers, and lateral sizes up to 500 μm. The tellurene transistors present air-stable performance at room temperature for over two months, with on/off ratios and current densities on the order of $10^6$ and 550 mA/mm, respectively. The thickness-dependent carrier mobility reaches the highest values ~700 $cm^2$/Vs for a thickness of ~16 nm. The tellurene also shows strong in-plane anisotropic properties. The novel versatile solution-grown process allows the access to a broad range of characterization and application of tellurene as a new 2D material for electronic, optical optoelectronic, sensing, and energy devices.

In one embodiment, the present disclosure provides substrate-free 2D tellurene crystals.

In one embodiment, the present disclosure provides substrate-free 2D tellurene crystals wherein the 2D tellurene crystals have a lateral length from 10-500 μm.

In one embodiment, the present disclosure provides a substrate-free 2D tellurene crystals wherein the 2D tellurene crystals have a thickness from 0.5-500 nm.

In one embodiment, the present disclosure provides a method of preparing substrate-free 2D tellurene crystals, wherein the method comprises reacting sodium tellurite ($Na_2TeO_3$) and hydrazine ($N_2H_4$) in an alkaline condition (pH>7) with the presence of polyvinylpyrrolidone (PVP) to provide 2D tellurene, adding acetone to the as-synthesized 2D tellurene solution to provide 2D tellurene crystals with thickness between 0.5-10 nm.

DETAILED DESCRIPTION

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure the term "about" can allow for a degree of variability in a value or range, for example, within 10%, within 5%, or within 1% of a stated value or of a stated limit of a range.

In the present disclosure, the term "2D tellurene" refers to an allotrope of tellurium element. The term "2D tellurene" refers the allotrope in the form of two-dimensional, atomic scale, and hexagonal lattice in which one atom forms each vertex. One well-known 2D material is graphene, which is an allotrope of carbon.

In the present disclosure, the term "lateral" refers to either the length or width of the 2D tellurene crystals. Therefore, "lateral length" may refer to either the length of the length side or width side of the crystals.

In the present disclosure, the term "substrate-free 2D tellurene" refers to 2D tellurium crystals that are prepared through a solution condition instead of being deposited on a substrate as disclosed by Chen et al. regarding 2D tellurene grown on highly oriented pyrolytic graphite (HOPG) substrate by molecular-beam epitaxy (MBE). The disadvantage of 2D tellurene grown on highly oriented pyrolytic graphite (HOPG) substrate is that such material cannot be easily used and is not available as standalone 2D tellurene crystal. Therefore, the substrate-free 2D tellurene disclosed in the present disclosure provides a standalone, stable and convenient source of pure 2D tellurene. A skilled artisan will appreciate that "substrate-free 2D tellurene" refers to "substrate-free 2D tellurene" as made. The later prepared composition by any other physical and/or chemical mixing or combining the as made "substrate-free 2D tellurene" with another material, even could be named as "substrate", should still be within the definition of "substrate-free 2D tellurene" as defined here.

Group VI tellurium (Te) has a trigonal crystal lattice in which individual helical chains of Te atoms are stacked together by van der Waals type bonds and spiral around axes parallel to the direction at the center and corners of the hexagonal elementary cell. Each tellurium atom is covalently bonded with its two nearest neighbors on the same chain. Tellurium can be considered as a 1D van der Waals solid. Earlier studies revealed bulk Te has small effective masses and high hole mobilities due to spin-orbit coupling. The lone-pair and anti-bonding orbitals give rise to a slightly indirect bandgap in the infrared regime (~0.35 eV) in bulk Te. The conduction band minimum (CBM) in bulk Te is located at the H-point, while valence band maximum (VBM) is slightly shifted from the H-point along the chain direction, giving rise to hole pockets near H-point. When the thickness is reduced, the indirect feature becomes more prominent. For example, the VBM of 4-layer Te is further shifted to (0.43, 0.34) (in the unit of the surface reciprocal cell), while CBM remains at (½, ⅓). Accompanied by the shift of VBM, the band gap also increases due to the quantum confinement effect, and eventually reaches ~1 eV for monolayer Te20. Te has other appealing properties, e.g. photoconductivity, thermoelectricity, and piezoelectricity for applications in sensors, optoelectronics, and energy devices. A wealth of synthetic methods has been developed to derive Te nanostructures, which favor the 1D form due to the inherent structural anisotropy in Te. Much less is known about the 2D form of Te and related properties.

Large-area, high-quality, and substrate-free 2D Te crystals (termed tellurene) were synthesize with a solution process. The term X-ene is used to generally describe 2D forms of elemental materials without considering the specific bonding. The samples are grown through the reduction of sodium tellurite ($Na_2TeO_3$) by hydrazine hydrate ($N_2H_4$) in an alkaline solution at temperatures from 160-200° C., with the presence of crystal-face-blocking ligand polyvinylpyrrolidone (PVP). The tellurene flakes can be transferred and assembled at large scale, through a Langmuir-Blodgett process, onto various substrates for characterization and device integration. The structure, composition, and quality of these tellurene crystals have been analyzed by high angle annular dark field scanning transmission electron microscopy (HAADF-STEM), high-resolution transmission electron microscopy (HRTEM), energy dispersive X-ray spectroscopy (EDS), and X-ray diffraction (XRD) No point defects or dislocations were observed over a large area within single crystals. EDS result confirmed the chemical composition of Te. Similar characterizations and analyses of dozens of tellurene flakes with different sizes indicate that all samples grow laterally along the <0001> and <1210> directions, with the vertical stacking along the <1010> directions.

The controlled PVP concentration is critical for obtaining 2D tellurene. When a smaller amount of PVP is used, the first 2D structures occur after a shorter reaction time. A closer examination of reactions with different PVP concentrations reveals an intriguing morphology evolution in growth products with time. For each PVP concentration, the initial growth products are dominantly 1D nanostructures. After a certain period of reaction, structures possessing both 1D and 2D characteristics start to emerge. TEM characterizations indicate that the long axes of these flakes are <0001> oriented, and the lateral protruding regions) grow along the <1210> directions, with the {1010} facets as the top/bottom surfaces. The 2D regions are enclosed by edges with atomic level step roughness. These high energy edges are not specific to certain planes during the intermediate states. These structures also have more uneven surfaces compared to 2D tellurene, further manifesting their intermediate nature. Finally, the ratio of 2D tellurene flakes which have a straight {1210} edge increases with a reduction in 1D and intermediate structures and reaches a plateau after an extended growth, e.g. ~30 hours. The growth with a lower level of PVP has a smaller final productivity. The observed morphology evolution suggests that the balance between the kinetic and thermodynamic growth dictates the transformation from 1D structures to 2D forms. In the initial growth, PVP is preferentially adsorbed on the {1010} surfaces of the nucleated seeds25, which promotes the kinetic-driven 1D growth. When the reaction continues, {1010} surfaces of the formed structures would become partially covered due to the insufficient PVP capping. Since {1010} surfaces have the lowest free energy in tellurium, the growth of {1010} surfaces along the <1210> direction significantly increases through the thermodynamic-driven assembly, giving rise to the observed intermediate structures. The enhanced growth along the <1210> directions together with the continued <0001> growth leads to the formation of 2D tellurene.

The sizes and thicknesses of tellurene can also be effectively modulated by controlling the ratio between sodium tellurite and PVP. The width of tellurene monotonically decreases with the reduction of PVP level; the thickness is minimized when a medium level of PVP is used (e.g. Na2TeO3/PVP ratio ~52.4/1), and increases with both the increase and decrease of PVP. With a small amount of PVP, the solution is supersaturated with Te source, and homogeneous nucleation of Te can occur in large scale, consuming resource for subsequent growth. As a result, the Ostwald ripening of Te nuclei is shortened, and the final tellurene crystals have smaller sizes compared to samples grown at higher PVP concentrations. The low PVP level also leads to more significant growth along thickness directions. On the other hand, when the PVP level is high, the fewer nucleation events allow the sufficient supply of Te source for subsequent growth, leading to the increased width and thickness. Also, the productivity of tellurene increases with the reaction temperature from 160° C. to 180° C. This is likely because higher temperature promotes the forward reaction rate in the half reaction of endothermic hydrazine oxidation. However, when temperature increases from 180° C. to 200° C., the possible breaking of the van der Waals bonds between Te chains by the excessive energy could lead to the saturated productivity.

The 2D tellurene crystals with a thickness smaller than 10 nm can be further derived through a solvent-assisted post-growth thinning process. The thickness of tellurene decreases with time after acetone is introduced into the growth solution. After 6 hours, the average thickness of tellurene is reduced to ~10 nm, with the thinnest flake down to 0.9 nm thick when sufficient amount of NaOH solution is added instead of adding acetone. Due to the poor solubility in acetone, PVP molecules tend to desorb from the tellurene and undergo aggregation, giving rise to the sediment of tellurene over the time in acetone. Lacking the protection of PVP, the tellurene surfaces get exposed and react with the alkaline growth solution (pH~11.5), leading to the reduced thickness. Other types of solvents may provide similar effect. PVP solubility in the solvent may significantly affect the post-growth thinning process.

These high-quality ultrathin tellurene crystals with controlled thicknesses provide an ideal system to explore their intrinsic properties in the 2D limit. Back-gate tellurene transistors was fabricated to assess their electronic properties. Excellent and air-stable transistor performances were achieved at room temperature for over two months without encapsulation. In particular, important metrics of devices such as on/off ratio, mobility, and current density are superior or comparable to transistors based on other 2D material. Source and drain regions were patterned by electron beam lithography with the channel parallel to the [0001] direction of tellurene. By simply scaling down the channel length to 100 nm, the maximum on current exceeds 550 mA/mm, which stands out among most 2D materials based transistors. Such large Ion values show the potential of the solution-grown tellurene in enabling novel low-power transistors. Remarkably, the tellurene transistors demonstrate good stability in the air without encapsulation. No significant degradation was observed in the transfer curves for the 15 nm tellurene transistor after two months being stored in air. Such an air-stability, superior to other materials such as phosphorene and silicene9, is likely due to the weak binding of oxygen atoms to Te surface, as shown by our first-principles calculations.

The process-tunable thickness of tellurene allows the modulation of device performance in tellurene transistors through tuning the electronic structures. We further explore the thickness dependence of two key metrics of material performance, on/off ratios and field-effect mobilities, to elucidate the transport mechanism of tellurene FETs. Field-effect mobilities with various thicknesses are displayed in FIG. 3b. It peaks with ~700 $cm^2/Vs$ at room temperature at around 16 nm thickness and decreases gradually with the further increase of the thickness. This trend is similar to layered materials that experience screening and interlayer coupling13, 14 (Supplementary Notes and Supplementary FIG. 15). We expect to be able to improve the mobility of tellurene through approaches such as surface passivation by high-k dielectric39 or h-BN. The thickness-dependent on/off ratios are shown in FIG. 3c, which steeply decrease from ~$10^6$ for a 4 nm crystal to less than 10 once the crystal thickness exceeds 25 nm, with a trend similar to reported layered materials13,14. The above results also indicate the importance of thickness engineering in tellurene transistors for different applications where the trade-off between higher mobility and better switching behavior need to be carefully considered, which warrants further investigations for testing the performance limit of tellurene FETs.

The in-plane anisotropy of few-layer tellurene flakes was also examined. Reduced in-plane symmetry in the crystal structure can lead to interesting anisotropic properties that may enable novel functionalities and applications of 2D materials. The anisotropic optical properties of as-synthesized tellurene was characterized by angle-resolved polarization Raman spectroscopy at room temperature. The incident light comes in along the [1010] direction and is polarized into the [0001] helical chain direction of the tellurene. Three Raman active modes locating at 92 $cm^{-1}$ (E-mode), 121 cm-1 (A1 mode) and 141 cm-1 (E-mode) were identified. By rotating the tellurene flake in steps of 30°, changes were observed in the angle-resolved Raman peak intensities. The peak intensities of different modes were extracted by fitting with Gauss function and plotted them into the corresponding polar figures. The angle-resolved Raman results confirm that the helical Te atom chains in the as-synthesized tellurene are oriented along the growth direction of the tellurene flake. The first-principle calculations show a similar degree of anisotropy in the effective masses along these two orthogonal directions.

In summary, a simple, low-cost, solution-based chemical pathway to the scalable synthesis and assembly of 2D tellurene crystals was developed. These high-quality 2D ultrathin tellurene crystals have high carrier mobility and are air-stable. This approach has the potential to produce stable, high-quality, ultrathin semiconductors with a good control of composition, structure, and dimensions for applications in electronics, optoelectronics, energy conversion, energy storage, sensors, and quantum devices. Tellurene, as a 1D van der Waals solid, adds a new class of nanomaterials to the large family of 2D crystals and enables possibilities for the further investigation of many exciting properties and intriguing applications.

In one embodiment, the present disclosure provides substrate-free 2D tellurene crystals.

In one embodiment, the present disclosure provides a composition comprising substrate-free 2D tellurene crystals.

In one embodiment, the present disclosure provides a composition comprising substrate-free 2D tellurene crystals, wherein the 2D tellurene crystals comprising single crystals.

In one embodiment, the 2D tellurene crystals in the present disclosure have a lateral length from 0.1-500 µm, 0.1-250 µm, 0.1-100 µm, 0.1-50 µm, 10-500 µm, 10-250 µm, 10-100 µm, 10-50 µm, 20-500 µm, 20-250 µm, 20-100 µm, 20-50 µm, 30-500 µm, 30-250 µm, 30-100 µm, 30-50 µm, 40-500 µm, 40-250 µm, 40-100 µm, 40-50 µm.

In one embodiment, the substrate-free 2D tellurene crystals in the present disclosure have a thickness from about 0.5-250 nm, 0.5-200 nm, 0.5-150 nm, 0.5-100 nm, 0.5-50 nm, 1-250 nm, 1-200 nm, 1-150 nm, 1-100 nm, 1-50 nm.

In one embodiment, the substrate-free 2D tellurene crystals in the present disclosure are mono layer crystals. In one aspect, the substrate-free 2D tellurene crystals are at least two-layer crystals. In one aspect, the substrate-free 2D tellurene crystals are 1-500 layer crystals. In one aspect, the substrate-free 2D tellurene crystals are 1-250 layer crystals, 1-100 layer crystals, 1-50 layer crystals In one embodiment, the present disclosure provides a method of preparing substrate-free 2D tellurene crystals, wherein the method comprises reacting sodium tellurite ($Na_2TeO_3$) and hydrazine ($N_2H_4$) in an alkaline condition (pH>7) with the presence of polyvinylpyrrolidone (PVP).

In one embodiment, the present disclosure provides a method of preparing substrate-free 2D tellurene crystals, wherein the method comprises reacting sodium tellurite ($Na_2TeO_3$) and hydrazine ($N_2H_4$) in an alkaline condition (pH>7) with the presence of polyvinylpyrrolidone (PVP), wherein the mole ratio of $Na_2TeO_3$/PVP is at least 5:1. In one aspect, the $Na_2TeO_3$/PVP ratio is at least 10:1, 15:1, 20:1, 30:1, 40:1, 50:1, 60:1, 70:1, 80:1, 90:1, 100:1, 200:1, 300:1, 400:1, 500:1. In one aspect, the $Na_2TeO_3$/PVP ratio is about 5-500:1, 10-500:1, 20-500:1, 30-500:1, 40-500:1, 50-500:1, 60-500:1, 70-500:1, 80-500:1, 90-500:1, 100-500:1, 150-500:1, 200-500:1, 250-500:1, 300-500:1, 350-500:1, 400-500:1.

In one embodiment, the present disclosure provides a method of preparing substrate-free 2D tellurene crystals, wherein the method comprises reacting sodium tellurite ($Na_2TeO_3$) and hydrazine ($N_2H_4$) in an alkaline condition (pH>7) with the presence of polyvinylpyrrolidone (PVP), wherein the reaction temperature is 120-250° C. In one aspect, the reaction temperature is 150-250° C., 160-250° C., 170-250° C., 180-250° C., 160-225° C., 170-225° C., 180-225° C.

In one embodiment, the present disclosure provides a method of preparing substrate-free 2D tellurene crystals, wherein the method comprises reacting sodium tellurite ($Na_2TeO_3$) and hydrazine ($N_2H_4$) in an alkaline condition (pH>7) with the presence of polyvinylpyrrolidone (PVP), wherein the reaction time is 1-100 hours, 1-75 hours, 1-50 hours, 5-100 hours, 5-75 hours, 5-50 hours, 10-100 hours, 10-75 hours, 10-50 hours.

In one embodiment, the present disclosure provides a method of preparing substrate-free 2D tellurene crystals, wherein the method comprises reacting sodium tellurite ($Na_2TeO_3$) and hydrazine ($N_2H_4$) in an alkaline condition (pH>7) with the presence of polyvinylpyrrolidone (PVP) to provide 2D tellurene, adding acetone to the as-synthesized 2D tellurene solution to provide 2D tellurene crystals with thickness between 1-10 nm.

Experiments

Synthesis of 2D Tellurene Crystals

In a typical procedure, analytical grade $Na_2TeO_3$ and a certain amount of poly(-vinyl pyrrolidone) (PVP, M.W.=58000) was put into double distilled water at room temperature under magnetic stirring to form a homogeneous solution. PVP at different molecular weight range such as 8000-1,300,000 may be used. The resulting solution was poured into a Teflon-lined stainless steel autoclave, which was then filled with an aqueous ammonia solution and hydrazine hydrate. The autoclave was sealed, and maintained at the reaction temperature for designed time. Then the autoclave was cooled to room temperature naturally. The resulting silver-gray, solid products were precipitated by centrifuge and washed with distilled water.

Langmuir-Blodgett (LB) Transfer of Tellurene

The hydrophilic 2D Te nanoflake monolayers can be transferred to various substrates by the Langmuir-Blodgett (LB) technique. The washed nanoflakes were suspended in a mixture solvent made of N,N-dimethylformamide (DMF) and CHCl3. Then, the mixture solvent was dropped into the deionized water. Too much DMF will result in the falling of 2D Te in the water. It is difficult to mix the DMF, CHCl3 and 2D Te when CHCl3 is too much. After the evaporation of the solvent, a monolayer assembly of 2D Te flakes was observed at the air/water interface. Then we can transfer the monolayer assembly of 2D Te onto the substrates.

First-Principles Calculations

Density Functional Theory calculations were performed using the Vienna Ab-initio Simulation Package (VASP)1 with projector augmented wave (PAW) pseudopotentials2. The value 500 eV was used for the plane-wave cutoff, 5×5×1 Monkhorst-Pack sampling, and fully relaxed the systems until the final force on each atom was less than 0.01 eV/Å. The PBE exchange-correlation functional is used for relaxation of the system, and the HSE functional is employed to calculate the band gaps and the band edge levels. While for bilayer and thicker Te, the structure is similar to that of bulk Te. The calculations show a lattice parameter of 4.5 Å and 6.0 Å for multilayers, in agreement with experiments. The adsorption of O on bilayer Te and P is modeled by using 4×3 cell.

Structural Characterization

The morphology of the ultrathin tellurene crystals was identified by optical microscopy (Olympus BX-60). The thickness was determined by AFM (Keysight 5500). High-resolution STEM/TEM imaging and SAED has been performed using a probe-corrected JEM-ARM 200F (JEOL USA, Inc.) operated at 200 kV and EDS has been collected by an X-MaxN100TLE detector (Oxford Instruments). In HAADF-STEM mode, the convergence semi-angle of electron probe is 24 mrad, and the collection angle for ADF detector was set to 90-370 mrad.

Determination of Tellurene Productivity

To quantify the ratio of 2D tellurene flake in the products, all the products in the same process were measured as follows: the freshly prepared 2D tellurene solution was centrifuged at 5000 rpm for 5 minutes after adding acetone and washed with alcohol and double distilled water twice. Then the 2D tellurene flakes were dispersed into double distilled water. After that, the dispersed solution was dropped onto the 1×1 $cm^2$ SiO2/Si substrate. After the water evaporation, the optical microscope was used to record several images randomly covering the 5×5 $mm^2$ area. In the end, the areas covered by 2D tellurene was analyze by ImageJ, a public domain, Java-based image processing program developed at the National Institutes of Health. In the present disclosure, the productivity was defined as the ratio of the 2D tellurene area in the entire image.

Solvent-Assisted Post-Growth Thinning Process

The as-synthesized 2D tellurene solution (1 mL) was mixed with acetone (3 mL) at the room temperature. After a certain time (e.g. 6 hours), the thin 2D tellurene can be obtained by centrifuge at 5000 rpm for 5 minutes. After doing the LB process, the 2D tellurene can be transferred onto the substrate.

Device Fabrication and Transport Measurement

Upon transferring the tellurene flakes onto 300 nm SiO2/Si substrates, source and drain regions were patterned by electron beam lithography with 2 μm of channel length. The 50/50 nm Pd/Au was chosen as a metal contact since Pd has relatively high work function thus benefits the p-type transistors by reducing Schottky contact resistance. The transport measurements were performed using Keithley 4200A semiconductor characterization system. By plugging numbers into the formula: $\mu_{FE}=g_m L_W C_{ox} V_{ds}$/, where $g_m$, and $C_{ox}$ are transconductance, channel length, channel width and gate oxide capacitance, the field-effect mobilities for the tellurene transistors can be derived.

Raman Spectra

Angle-resolved Raman Spectra were measured at room temperature. The crystal symmetry of Te renders one A1 mode, one A2 mode (Raman-inactive), and two doublet E modes at Γ point of Brillouin zone. Raman signal was excited by 633 nm He—Ne laser. Three Raman active modes locating at 92 cm-1 (E-mode), 121 cm-1 (A1 mode) and 141 cm-1 (E-mode) respectively were identified. The incident light comes in along [−1010] direction which is perpendicular to the Te flake surface and was polarized into [0001] direction, which is parallel to spiral atom chains and we denote this configuration as 0°. Angle-resolved Raman peak intensity change was observed. The peak intensities of different modes were extracted by fitting with Gauss function and plotted them into polar figures. The angle-resolved Raman results confirm that the helical Te atom chain is indeed along the long axis of the Te flake.

XRD Patterns of the Crystals

The XRD patterns of the crystals are obtained on a D8 Advance X-ray powder diffractometer, equipped with a CuKa source (λ=1.54056 A) and a Vantec detector, operating at 40 kV and 40 mA. Each sample is scanned between 20° and 65° in 2θ, with a step size of 0.0057° in 2θ and a scan rate of 11.41 seconds/step, and with 2.1 mm divergence and receiving slits and a 0.1 mm detector slit. The washed 2D flakes are directly deposited on the Si wafer with smooth surface. The crystal form diffraction patterns are collected at ambient temperature and relative humidity. The background for the crystal is removed by Jade 6.5 prior to peak picking.

It is well known in the crystallography art that, for any given crystal form, the relative intensities of the diffraction peaks may vary due to preferred orientation resulting from factors such as crystal morphology and habit. Where the effects of preferred orientation are present, peak intensities are altered, but the characteristic peak positions of the 2D Te are unchanged. Furthermore, it is also well known in the crystallography art that for any given crystal form the angular peak positions may vary slightly. For example, peak positions can shift due to a variation in the temperature or humidity at which a sample is analyzed, sample displacement, the presence or absence of an internal standard, or the reaction residue which is not completely removed. In the present case, a peak position variability of ±0.1 in 2θ will be taken into account these potential variations without hindering the unequivocal identification of the indicated crystal form.

Conformation of a crystal form may be made based on any unique combination of distinguishing peaks (in units of ° 2θ), typically the more prominent peaks. Thus, a prepared sample of 2D Te is characterized by an XRD pattern using CuKa radiation as having diffraction peaks (2-theta values) as demonstrated in Table 2.

TABLE 2

X-Ray Crystal Diffraction Peaks of 2D Tellurene

| Angel ° 2θ | Intensity (%) | Crystallographic plane |
|---|---|---|
| 23.79 | 100.0 | (100) |
| 41.26 | 29.2 | (110) |
| 47.79 | 41.5 | (200) |
| 50.41 | 7.8 | (201) |
| 64.43 | 12.2 | (210) |

Those skilled in the art will recognize that numerous modifications can be made to the specific implementations described above. The implementations should not be limited to the particular limitations described. Other implementations may be possible.

The invention claimed is:

1. A composition comprising substrate-free 2D tellurene crystals, wherein the 2D tellurene crystals are characterized by an X-ray diffraction pattern (CuKα radiation, λ=1.54056 A), wherein the X-ray diffraction pattern consists of five peaks from a range of 23.79 (2θ±0.1°) to 64.43 (2θ±0.1°) within an intensity range of 7.8% to 100%, and wherein the five peaks are ranked in an order of intensity from high to low by 23.79 (2θ±0.1°), 47.79 (2θ±0.1°), 41.26 (2θ±0.1°), 64.43 (2θ±0.1°), and 50.41 (2θ±0.1°).

2. The composition of claim 1, wherein the 2D tellurene crystals have a lateral length from 0.1-500 μm.

3. The composition of claim 2, wherein the 2D tellurene crystals have a lateral length from 0.1-100 μm.

4. The composition of claim 1, wherein the 2D tellurene crystals have a thickness from 0.5-250 nm.

5. The composition of claim 4, wherein the 2D tellurene crystals have a thickness from 0.5-100 nm.

6. The composition of claim 1, wherein the 2D tellurene crystals comprises 2D tellurene single crystals.

7. The composition of claim 1, wherein the 2D tellurene crystals comprises mono layer 2D tellurene crystals.

8. The composition of claim 1, wherein the 2D tellurene crystals comprises two or more layers of 2D tellurene crystals.

* * * * *